United States Patent [19]
Cuchiaro et al.

[11] Patent Number: 6,165,802
[45] Date of Patent: Dec. 26, 2000

[54] METHOD OF FABRICATING FERROELECTRIC INTEGRATED CIRCUIT USING OXYGEN TO INHIBIT AND REPAIR HYDROGEN DEGRADATION

[75] Inventors: Joseph D. Cuchiaro, Colorado Springs, Colo.; Akira Furuya, Tokyo, Japan; Carlos A. Paz de Araujo, Colorado Springs, Colo.; Yoichi Miyasaka, Tokyo, Japan

[73] Assignees: Symetrix Corporation, Colorado Springs, Colo.; NEC Corporation, Japan

[21] Appl. No.: 09/062,258

[22] Filed: Apr. 17, 1998

[51] Int. Cl.$^7$ .................................................. H01L 21/00
[52] U.S. Cl. .......................... 438/3; 438/210; 438/240; 438/781; 257/43; 257/295; 257/310
[58] Field of Search ............... 438/3, 210, 240, 438/781; 365/145, 53; 257/295, 43, 310

[56] References Cited

U.S. PATENT DOCUMENTS

| | | | |
|---|---|---|---|
| 5,434,102 | 7/1995 | Watanabe et al. | 437/130 |
| 5,439,845 | 8/1995 | Watanabe et al. | 437/130 |
| 5,481,490 | 1/1996 | Watanabe et al. | 365/145 |
| 5,498,569 | 3/1996 | Eastep | 437/187 |
| 5,508,226 | 4/1996 | Ito et al. | 437/130 |
| 5,519,234 | 5/1996 | Araujo et al. | 257/295 |
| 5,523,595 | 6/1996 | Takenaka et al. | 257/295 |
| 5,716,875 | 2/1998 | Jones et al. | 438/3 |
| 5,784,310 | 7/1998 | Cuchiaro et al. | 365/145 |

OTHER PUBLICATIONS

Article: H. Achard and H. Mace; "Integration of Ferroelectric Thin Films For Memory Applications"; Science and Technology of Electroceramic Thin Films; Kluwer Academic Publishers, 1995; pp. 353–372, inclusive.

Symposium Abstract: Ilsub Chung, et al.; "Integration of Ferroelectric Capacitors Using Multilayered Electrode"; The Tenth International Symposium on the Applications of Ferroelectrics, Aug. 18–21, 1996, Hilton Hotel, East Brunswick, NJ, Rutgers University; p. 55.

Symposium Abstract: Takashi Hase, et al.; "Analysis of the Degradation of PZT and $SrBi_2Ta_2O_9$ Thin Films With a Reductive Process"; The Eighth International Symposium on Integrated Ferroelectrics, Mar. 18–20, 1996, Tempe, AZ; Plenary Talks, Invited Lectures and Contributed Papers.

*Primary Examiner*—Charles Bowers
*Assistant Examiner*—Hsien-Ming Lee
*Attorney, Agent, or Firm*—Duft, Graziano & Forest, P.C.

[57] ABSTRACT

An integrated circuit is formed that contains a ferroelectric element comprising metal oxide material containing at least two metals. An oxygen-recovery anneal is conducted in ambient oxygen at a temperature range from 300° to 1000° C. for a time period from 20 minutes to 2 hours. The oxygen-recovery anneal reverses the effects of hydrogen degradation and restores ferroelectric properties. The oxygen-recovery anneal is more effective as the annealing temperature and annealing time increase. Preferably the metal oxide element comprises a layered superlattice compound. Hydrogen degradation of the ferroelectric properties is minimized when the layered superlattice compound comprises strontium bismuth tantalum niobate and the niobium/tantalum mole ratio in the precursor is about 0.4. Hydrogen degradation is further minimized when at least one of the superlattice generator-element and the B-site element of the layered superlattice compound is present in excess of the amounts represented by the balanced stoichiometric formula of the compound.

13 Claims, 7 Drawing Sheets

METHOD OF FABRICATING FERROELECTRIC INTEGRATED CIRCUIT USING OXYGEN TO INHIBIT AND REPAIR HYDROGEN DEGRADATION

BACKGROUND OF THE INVENTION

1. Field of the Invention

The invention relates to a method for fabricating a ferroelectric integrated circuit that reduces or eliminates the degradation of electronic properties resulting from hydrogen exposure.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$ type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See Watanabe, U.S. Pat. No. 5,434,102. Layered superlattice compounds exhibit characteristics in ferroelectric memories that are orders of magnitude superior to those of PZT and PLZT compounds. While prototypes of ferroelectric memories have been made successfully with the layered superlattice compounds, there is as yet no manufacturing process for making memories using either the $ABO_3$ type oxides or the layered superlattice material compounds with the desired electronic characteristics economically and in commercial quantities. One reason, among others, for the lack of economical commercial processes for the fabrication of high quality ferroelectric integrated circuits is that the oxide compounds are susceptible to reduction by hydrogen during hydrogen annealing. Hydrogen annealing is a common step during CMOS integrated circuit memory fabrication and results in degradation of some important ferroelectric properties.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first or bottom electrode and a second or top electrode, the electrodes typically containing platinum. During manufacture of the circuit, the MOSFET is subjected to conditions causing defects in the silicon substrate. For example, the manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 400° C. for a time period of about 30 minutes. In addition, there are several other integrated circuit fabrication processes that expose the integrated circuit to hydrogen, often at elevated temperatures, such as CVD processes for depositing metals, growth of silicon dioxide from silane or TEOS sources, and etching processes using hydrogen. During processes that involve hydrogen, the hydrogen diffuses through the top electrode and the side of the capacitor to the ferroelectric thin film and reduces the oxides contained in the ferroelectric material. The absorbed hydrogen also metallizes the surface of the ferroelectric thin film by reducing metal oxides. As a result of these effects, the electronic properties of the capacitor are degraded. This problem is acute in ferroelectric memories containing layered superlattice compounds because these oxide compounds are particularly complex and prone to degradation by hydrogen-reduction.

3. Solution to the Problem

The invention solves the above problem by providing a method for fabricating ferroelectric elements in integrated circuits that reduces the detrimental effects of the hydrogen and preserves the favorable electronic properties of the ferroelectric element.

One aspect of the invention is performing an oxygen-recovery anneal to reoxidize chemical compounds in the ferroelectric element that were reduced during manufacturing steps causing hydrogenating and reducing conditions. The oxygen-recovery anneal is typically performed in the temperature range from 300° C. to 1000° C. for a time period from 20 minutes to 2 hours.

Another aspect of the invention is that the oxygen-recovery anneal is ambient tolerant, that is, it can be performed at atmospheric pressure with oxygen gas mixtures containing common ambient gases, such as nitrogen.

Another aspect of the invention is formation of a hydrogen barrier layer directly over at least a portion of the ferroelectric element.

In a preferred method, a nitride of titanium or silicon is formed to cover the protected portion of the ferroelectric element and serve as a hydrogen barrier.

Another aspect of the invention is formation of a ferroelectric thin film comprising a layered superlattice compound.

Another aspect of the invention is forming a ferroelectric element having layered superlattice compounds containing the chemical elements bismuth, strontium, niobium and tantalum in which the relative amounts of the chemical elements are selected to minimize the degradation of electronic properties by hydrogen.

Another aspect of the invention is formation of a ferroelectric thin film in which the layered superlattice compound comprises strontium bismuth tantalum niobate.

Another aspect of the invention is formation of a ferroelectric thin film in which the ferroelectric thin film comprising strontium bismuth tantalum niobate contains relative amounts of niobium and tantalum selected to inhibit hydrogen degradation of the ferroelectric material.

Another aspect of the invention is formation of a ferroelectric thin film in which at least one of said metals is present in an excess amount up to forty percent greater than the amount corresponding to a balanced stoichiometric formula.

Another aspect of the invention is formation of a ferroelectric thin film in which the ferroelectric thin film comprising strontium bismuth tantalum niobate contains an excess amount of at least one of the metals from the group comprising bismuth and niobium to inhibit hydrogen degradation of the ferroelectric material.

Another aspect of the invention is performing a hydrogen heat treatment in an atmosphere including hydrogen at a temperature of 350° C. or less, for a time period not greater than 30 minutes, wherein the mole fraction of hydrogen in said hydrogen atmosphere is from 0.01 to 50 percent.

A further aspect of the invention is the formation of a ferroelectric capacitor with a top electrode, a ferroelectric thin film and a bottom electrode.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
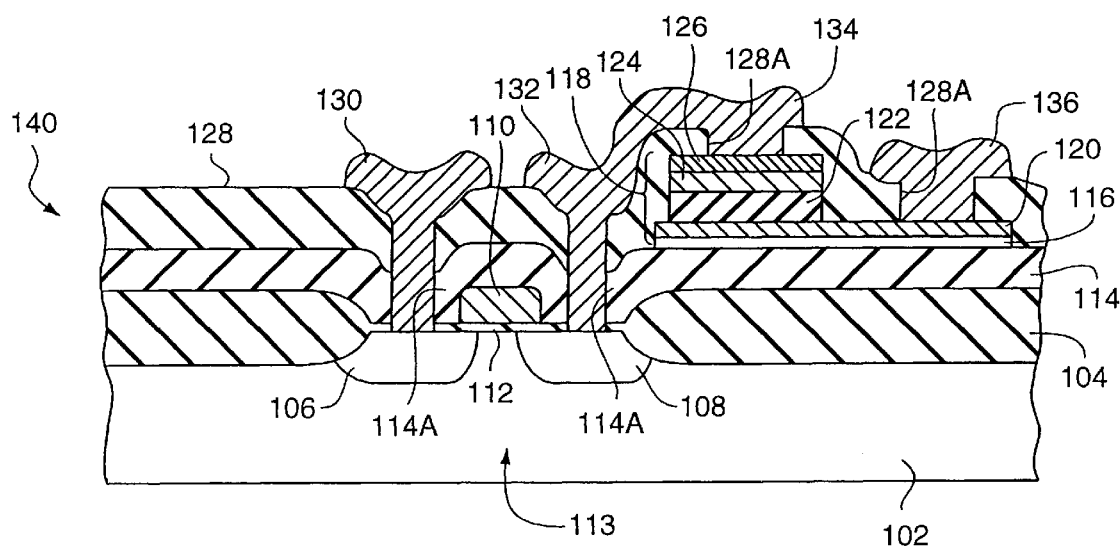
FIG. 1 is a cross-sectional view of a portion of an integrated circuit as may be fabricated by the method of the invention showing a nonvolatile ferroelectric memory cell.
Figure 3:
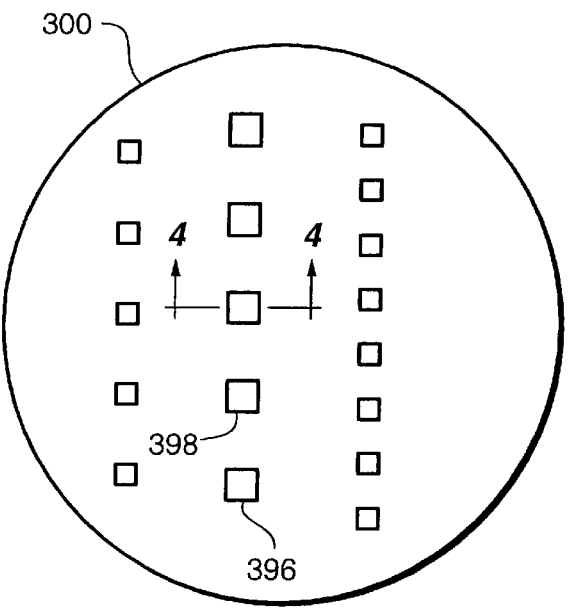
FIG. 3 is a top view of an exemplary wafer on which thin film capacitors fabricated in accordance with the invention are shown greatly enlarged.
Figure 4:
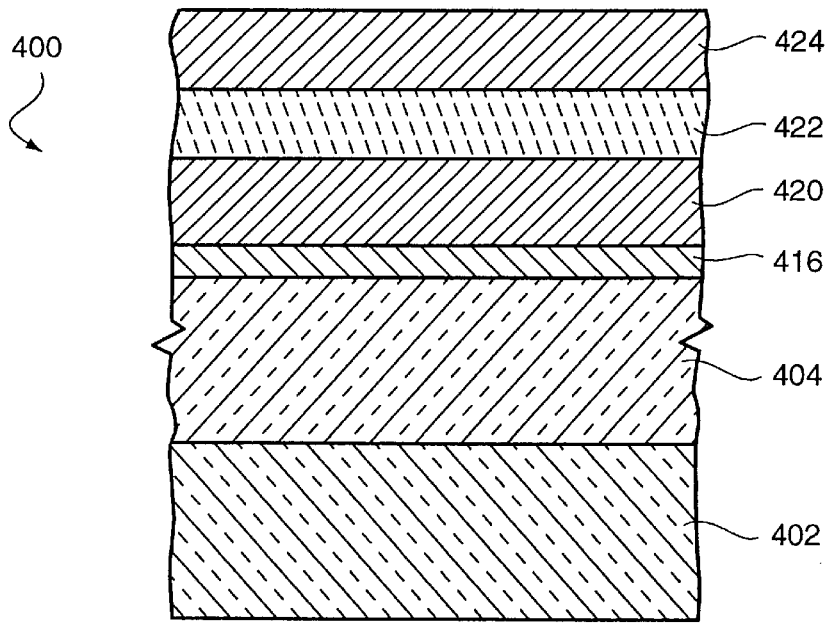
FIG. 4 is a portion of a cross-section of FIG. 3 taken through the lines 4—4, illustrating a thin film capacitor device fabricated in accordance with the invention.
Figure 6:
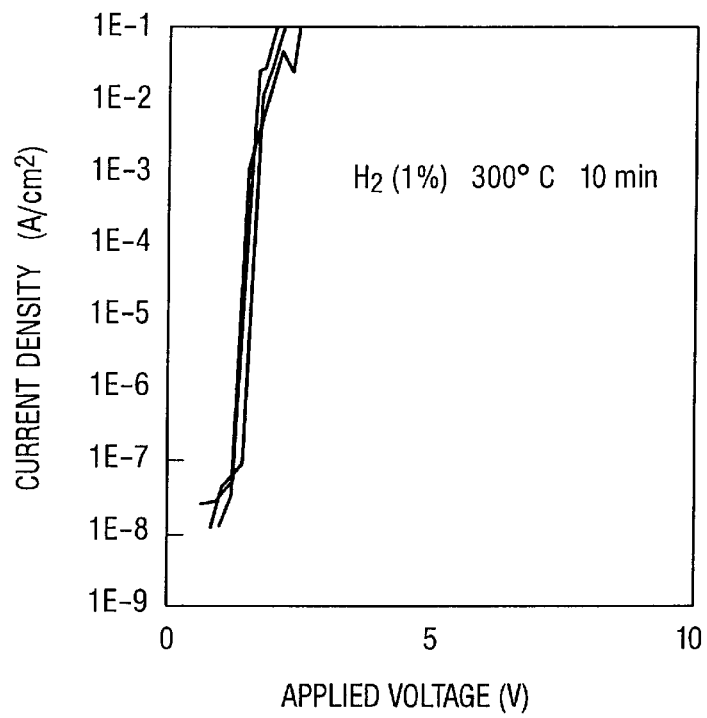
FIG. 6 is a graph of current density in $A/cm^2$ versus applied voltage in volts in strontium bismuth tantalum niobate capacitors after 10 minutes hydrogen annealing time at 300° C.
Figure 7:
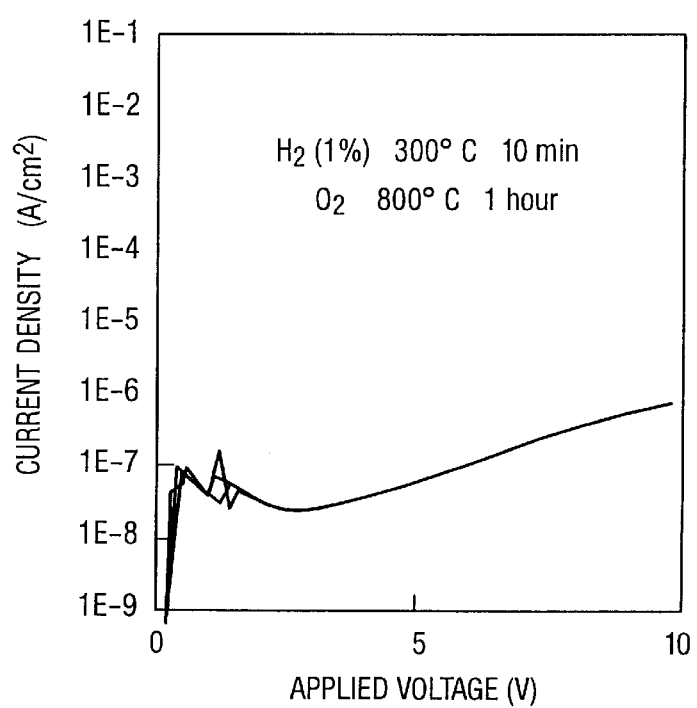
FIG. 7 is a graph of current density in $A/cm^2$ versus applied voltage in volts in strontium bismuth tantalum niobate capacitors after 10 minutes hydrogen annealing time at 300° C., followed by 1 hour of oxygen-recovery annealing at 800° C.

It should be understood that the FIGS. 1, 3 and 4 depicting ferroelectric integrated circuit devices are not meant to be actual plan or cross-sectional views of any particular portion of an actual integrated circuit device. In the actual devices the layers will not be as regular and the thickness may have different proportions. The various layers in actual devices often are curved and possess overlapping edges. The figures instead show idealized representations which are employed to depict more clearly and fully the structure and process of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. But, it would also be conceivable to use the method of this invention to fabricate a ferroelectric FET memory in which the ferroelectric element is incorporated in the switch element. Such a ferroelectric FET is described in McMillan, U.S. Pat. No. 5,523,964, which is incorporated herein by reference. Likewise, other integrated circuits fabricated using the method of the invention could include other elements and compositions of material.

Directing attention to FIG. 1, there is shown a cross-sectional view of an exemplary nonvolatile ferroelectric memory cell that could be fabricated according to the method of the invention. The general manufacturing steps for fabricating integrated circuits containing MOSFETs and ferroelectric capacitor elements is described in Yoshimori, U.S. Pat. No. 5,561,307, which is hereby incorporated by reference as if completely contained herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 112 is formed on the silicon substrate 102 between the source and drain regions 106 and 108. Further, a gate electrode 110 is formed on the gate insulating layer 112. These source region 106, drain region 108, gate insulating layer 112 and gate electrode 110 together form a MOSFET 113.

An interlayer dielectric layer (ILD) 114 made of BPSG (boron-doped phosphosilicate glass) is formed on substrate 102 and field oxide region 104. An adhesive layer 116 is formed on a portion of ILD 114, and then a ferroelectric thin film capacitor 118 is formed on adhesive layer 116. The adhesive layer 116 is made of, for example, titanium, and typically has a thickness of 200 Å.

Ferroelectric capacitor 118 is preferably formed on a conventional wafer 140 that may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers, such as titanium, enhance the adhesion of the electrodes to adjacent underlying or overlying layers of the circuits.

In FIG. 1, the ferroelectric capacitor 118 comprises a bottom electrode 120 made of platinum and having a thickness of 2000 Å (angstroms), a ferroelectric thin film 122 formed on the bottom electrode 120, a top electrode 124 formed on the ferroelectric film 122, made of platinum and having a thickness of 2000 Å, and preferably an electrically conductive hydrogen barrier layer 126 formed on the top electrode and having a thickness of 500–2000 Å. The hydrogen barrier layer 126 can comprise a single film, for example, titanium nitride or silicon nitride, or it can contain two or more films, for example, a bottom film of titanium, then a film of titanium nitride followed by a titanium film. If the barrier layer 126 is made from electrically conductive material, such as titanium nitride, and acts as a conducting element, then it is self-aligning. The hydrogen barrier layer can be deposited using a conventional sputtering technique. The composition and structure of the ferroelectric thin film 124 is discussed in more detail below.

A second interlayer dielectric layer (ILD) 128 made of NSG (nondoped silicate glass) is formed on ILD 114. A PSG (phospho-silicate glass) film or a BPSG film could also be used in ILD 128. Openings 114a are selectively opened through ILD 114 and ILD 128 to expose the source region 106 and gate region 108. Source electrode wiring 130 and drain electrode wiring 132 are formed to fill openings 114a. Other openings 128a are selectively opened through ILD 128 to expose the electrically conductive hydrogen barrier layer 126 and the bottom electrode 120. Top electrode wiring 134 and bottom electrode wiring 136 are formed to fill these openings 128a. The drain electrode wiring 132 is electrically connected to top electrode wiring 134. Each of these wirings 130, 132, 134 and 136 is made of Al—Si with a thickness of about 3000 Å. If barrier layer 126 is nonconductive, then it is necessary to remove at least a portion of the barrier layer 126 so that the wiring layer 134 can make electrical contact to top electrode 124.

The composition of the ferroelectric thin film 124 can be selected from a group of suitable ferroelectric materials, including but not limited to: an $ABO_3$-type perovskite, such as a titanate (e.g., $BaTiO_3$, $SrTiO_3$, $PbTiO_3$ (PT), $PbZrTiO_3$ (PZT)) or a niobate (e.g., $KNbO_3$), and, preferably, a layered superlattice compound.

U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. Nos. 5,434,102 issued Jul. 18, 1995 and 5,468,684 issued Nov. 21, 1995, incorporated herein by reference, describe processes for integrating these materials into practical integrated circuits.

The layered superlattice materials may be summarized generally under the formula:

$$A1_{w1}^{+a1}A2_{w2}^{+a2}\ldots Aj_{wj}^{+aj}S1_{x1}^{+s1}S2_{x2}^{+s2}\ldots Sk_{sk}^{+sk}B1_{y1}^{+b1}B2_{y2}^{+b2}\ldots Bl_{yl}^{+bl}Q_z^{-2}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{.75}Ba_{.25}Bi_2Ta_2O_9$, on the average, 75% of the A-sites are occupied by a strontium atom and 25% of the A-sites are occupied by a barium atom. If there is only one A-site element in the compound then it is represented by the "A1" element, and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2\ldots +ajwj)+(s1\times 1+s2\times 2\ldots +sk\times k)+(b1y1+b2y2\ldots +blyl)=2z. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "substrate" can mean the underlying wafer 102 on which the integrated circuit is formed, as well as any object on which a thin film layer is deposited, such as BPSG layer 114. In this disclosure "substrate" shall mean the object to which the layer of interest is applied; for example, when we are talking about a bottom electrode, such as 120, the substrate includes the layers 116 and 114 on which the electrode 120 is formed.

The term "thin film" is used herein as it is used in the integrated circuit art. Generally it means a film of less than a micron in thickness. The thin films disclosed herein are in all instances less than 0.5 microns in thickness. Preferably the ferroelectric thin films 122 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein, may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stochiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stochiometric" formula $SrBi_{2.18}Ta_{1.44}Nb_{0.56}O_9$, since it contains excess bismuth beyond what is needed to form a complete crystalline material. In this disclosure an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 122, 422, made according to the process of the invention will generally be less than that in the stochiometric formula for the precursor. However, the molar proportions of strontium, tantalum, and niobium in ferroelectric layer 122, 422, made according to the process of the invention will be very close or identical to the molar proportions given in the stochiometric formula for the precursor. See U.S. Pat. No. 5,434,102 issued to Watanabe et al.

A feature of the invention is that a final layered superlattice compound made from a precursor with excess metal is more resistant to degradation by hydrogen than material made from a precursor containing amounts of metal corresponding to a balanced stoichiometric formula. For example, amounts in the precursor of at least one metal, such as bismuth and niobium, above or in addition to that present in a balanced formula, inhibit hydrogen degradation. A related feature is that excess amounts of a B-site element, such as niobium, in a layered superlattice material are effective in preventing the degradation of the electronic properties by exposure to hydrogen.

Figure 2:
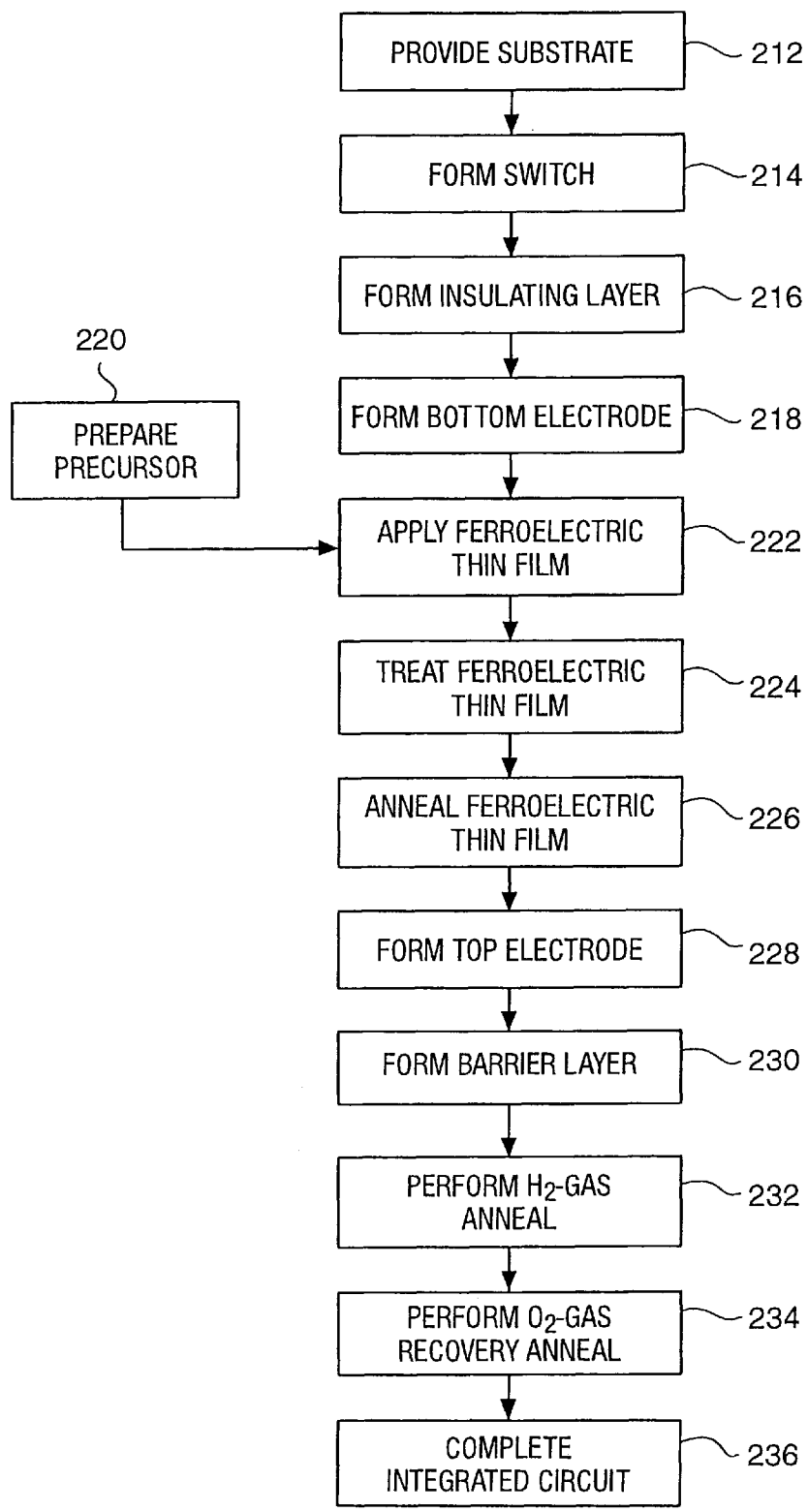
FIG. 2 is a flow chart showing the preferred embodiment of a process for fabricating a nonvolatile ferroelectric memory device according to the invention.

The diagram of FIG. 2 is a flow sheet of the fabrication steps used in this invention to make a ferroelectric memory. In step 212, a semiconductor substrate is provided on which a switch is formed in step 214. The switch is typically a MOSFET. In step 216, an insulating layer is formed to separate the switching element from the ferroelectric element to be formed. In step 218, a bottom electrode is formed. Preferably the electrode is made of platinum and is sputter-deposited to form a layer with a thickness of about 2000 Å. In the preferred method, an adhesion layer made of titanium or titanium nitride of about 200 Å would be formed in this step prior to depositing the electrode. The ferroelectric thin film is applied to the bottom electrode in step 222. In the preferred method, the ferroelectric thin film contains layered superlattice compounds. The ferroelectric thin films are preferably applied using a liquid deposition technique, such as spin-coating or a misted deposition method as described in U.S. Pat. No. 5,546,945. In the most preferred method, a spin-on technique is used to form the thin film. In step 220, chemical precursors of the layered superlattice compounds that will form the desired ferroelectric thin film are prepared. Usually, a final precursor solution is prepared from commercially available solutions containing the chemical precursor compounds. The preferred method utilizes a precursor solution containing relative molar proportions of the elements strontium, bismuth, tantalum and niobium corresponding approximately to the formula $SrBi_{2.18}Ta_{1.44}Nb_{0.56}O_9$, in which the mole ration of niobium to tantalum, Nb/Ta, is about 0.4. Preferably, the concentrations of the various precursors supplied in the commercial solutions are adjusted in step 220 to accommodate particular manufacturing or operating conditions. For example, the stoichiometric amounts of the various elements in a commercial solution for a layered superlattice thin film might be $SrBi_{2.18}Ta_{1.44}Nb_{0.56}O_9$. It is often desirable, however, to add extra niobium or bismuth to this solution to generate extra oxides that will protect the ferroelectric compounds from hydrogen-annealing degradation. The application step 222 is preferably followed by a treatment step 224 which preferably includes a drying step, a crystallization substep at elevated temperatures such as a rapid thermal process, and may include treatment with ultraviolet radiation during or after the application step 222. For example, in a typical spin-on procedure, a coat of the precursor might be applied and dried. Then another precursor coat might be applied and dried. The application and treatment steps 222 and 224 can be repeated several times. The treated film is then annealed in oxygen to form the resulting ferroelectric thin film in step 226. Following steps 222–226, the top electrode is formed in step 228. Step 228 and other steps would include substeps, such as ion milling and ashing. In the preferred method, a hydrogen barrier layer is formed in step 230 to cover at least the top electrode of the capacitor. Typically, the hydrogen barrier layer is titanium nitride, which inhibits diffusion of hydrogen into the ferroelectric and which is also electrically conductive. Since, in most cases, the layers below the ferroelectric layer are sufficiently thick to prevent hydrogen diffusion to the ferroelectric, the most important hydrogen barrier is a barrier that is deposited in one of the layers directly over the ferroelectric thin film. By "directly over" means that the barrier layer is above the ferroelectric layer in the vertical direction in FIGS. 1 and 4, and extends the length of the ferroelectric layer in the horizontal directions in FIGS. 1 and 4. The term does not mean that the barrier layer is in direct contact with the ferroelectric layer. The barrier layer may or may not contact the ferroelectric layer. As long as it is directly above a portion of the ferroelectric layer, it will protect that portion from hydrogen diffusion. It is also desirable to add a small amount of oxygen to the barrier layer by including a small amount of $O_2$-gas in the sputter atmosphere during sputter-deposition of the barrier layer. The resulting oxides that form in the barrier layer protect the ferroelectric compounds in the memory device by reacting with the hydrogen that can be present in various manufacturing process steps. In step 232, hydrogen annealing of the workpiece is conducted at a temperature and annealing time chosen to satisfactorily eliminate the defects caused in the silicon substrate by oxidation and to minimize hydrogen degradation of the ferroelectric compounds. The hydrogen annealing step is preferably performed with $H_2$-gas in ambient conditions because this is less complex than other alternatives, such as hydrogen-plasma annealing. In step 234, the oxygen-recovery anneal of the invention is performed to restore the electronic properties of the ferroelectric element that were degraded as a result of hydrogen annealing and other process steps causing hydrogenating or reducing conditions. The circuit would be completed in step 236, which could include a number of substeps, for example, deposition of an ILD, patterning and milling, and deposition of wiring layers.

Oxygen-gas recovery annealing performed at a temperature range of from 300° to 1000° C. for a time period from 20 minutes to 2 hours effectively reverses the degradation of electronic properties caused by hydrogen reduction in the ferroelectric element by reoxidizing the chemical compounds in the ferroelectric element. Nevertheless, it might not always be possible to accomplish the purpose of the oxygen-recovery anneal, that is, the repair of hydrogen damage in the ferroelectric element and other elements, by using the inventive oxygen-recovery anneal step. For these reasons, the method of the invention contemplates the use of various steps to protect the memory device from damage from hydrogen. These steps can be used in conjunction with the oxygen-recovery anneal step.

The beneficial effects of the oxygen-recovery anneal generally increase as the oxygen-anneal temperature increases and the annealing duration increases. Preferably the oxygen-recovery anneal of the integrated circuit is conducted under ambient conditions in a $O_2$-gas atmosphere at a temperature of about 800° C. for a time period of about one hour.

The oxygen-recovery anneal of the present invention is effective in protecting the electronic characteristics of non-volatile ferroelectric capacitors in which the ferroelectric thin film contains Bi-layered superlattice material made from a precursor with a composition corresponding approximately to the general formula $SrBi_{2.18}Ta_{2-x}Nb_x$, where $0 \leq x \leq 2$. Experiments have shown that the oxygen-recovery anneal treatment is effective in restoring desired ferroelectric properties in layered superlattice compounds made from a precursor solution with a composition corresponding approximately to the general stoichiometric formula $SrBi_{2.18}Ta_{1.44}Nb_{0.56}O_9$, in which the mole ratio Nb/Ta in the precursor is about 0.4. Experiments have further shown that addition of bismuth or niobium to the precursor in excess of the relative amounts corresponding to the formula $SrBi_{2.18}Ta_{1.44}Nb_{0.56}O_9$ is effective in protecting desired electronic characteristics from hydrogen degradation. The preferred method of the invention provides a ferroelectric capacitor in which at least the top electrode is covered by a hydrogen barrier layer, preferably containing titanium nitride.

FIG. 3 is a top view of an exemplary wafer on which thin film capacitors 396, 398 and 400 fabricated on substrate 300 in accordance with the invention are shown greatly enlarged. FIG. 4 is a portion of a cross-section of FIG. 3 taken through the lines 4—4, illustrating a thin film capacitor device fabricated in accordance with the invention. A silicon dioxide layer 404 is formed on a silicon crystal substrate 402. A titanium adhesion layer 416 is formed on the silicon dioxide layer 404. Then bottom electrode 420 made of platinum is sputter-deposited on adhesion layer 416. Layer 422 is a ferroelectric thin film, and layer 424 represents the top electrode made of platinum.

EXAMPLE 1

The electronic properties of strontium bismuth tantalum niobate capacitors were studied before and after annealing in $H_2$-gas at temperatures of 200°, 250° and 300° C. for 10, 30 and 60 minutes. Then, the capacitors were treated with an oxygen-recovery anneal at 200°, 300°, 400° and 800° C. for one hour, and the electronic properties were measured again.

The capacitors were fabricated from a strontium bismuth tantalum niobate precursor solution commercially available from Hughes Aircraft Company, Product No. HAC10475-47. The solution contained amounts of chemical precursors corresponding to the stoichiometric formula $SrBi_{2.18}Ta_{1.44}Nb_{0.56}O_9$. The mole ratio of niobium to tantalum, Nb/Ta, in the precursor was, therefore, about 0.4. The 0.2 mol/l precursor solution in this example contained: tantalum 2-ethylhexanoate, bismuth 2-ethylhexanoate, strontium 2-ethylhexanoate, niobium 2-ethylhexanoate, 2-ethylhexanoate, and xylene. Ferroelectric capacitors containing the layered superlattice compound were formed from the precursor solution in general accordance with the method described in Watanabe, U.S. Pat. No. 5,434,102, which is hereby incorporated by reference as if wholly contained herein.

A series of p-type 100 Si wafer substrates 402 were oxidized to form a layer of silicon dioxide 404. A titanium adhesive layer 416 of 200 Å thickness was sputtered on the substrate, then a bottom platinum electrode 420 of 3000 Å thickness was sputter-deposited on adhesive layer 416. These were annealed 30 minutes in $O_2$ at 650° C., and dehydrated 30 minutes at 180° C. in low vacuum. A spincoat of 0.2 molar solution of the strontium bismuth tantalum niobate compound was deposited on the bottom electrode 420 at 1500 rpm for 30 seconds. This was dehydrated for 1 minute at 160° C., increasing to 260° C. for 4 minutes. The sequence of the spincoat and dehydration steps was repeated. The ferroelectric coating was crystallized using rapid-thermal-annealing (RTA 725° C.30 sec, 100° C./sec). These steps formed a ferroelectric thin film 422 having a thickness of 2100±150 Å. The wafer and deposited layers were given a first anneal for 60 minutes at 800° C. Platinum was sputter-deposited to make a top electrode layer 424 with 2000 Å thickness, followed by PR treatment. The platinum and strontium bismuth tantalum niobate layers were milled to form the capacitors, and then ashing was performed, followed by a second $O_2$ anneal for 30 minutes at 800° C.

Before the capacitors were annealed in hydrogen gas, the electronic properties of five capacitors, each with an area of 7854 $\mu m^2$, were measured. The leakage current in the capacitors was about $10^{-7}$ A/cm² at 5 volts. Remanent polarization (2Pr) measured at 5 volts was about 23 $\mu C/cm^2$.

Hydrogen annealing was then performed on capacitors in a $H_2$-$N_2$ ($H_2$ 1%) mixture under ambient conditions, at 200°, 250°, and 300° C. for 10, 30, and 60 minutes.

Figure 5:
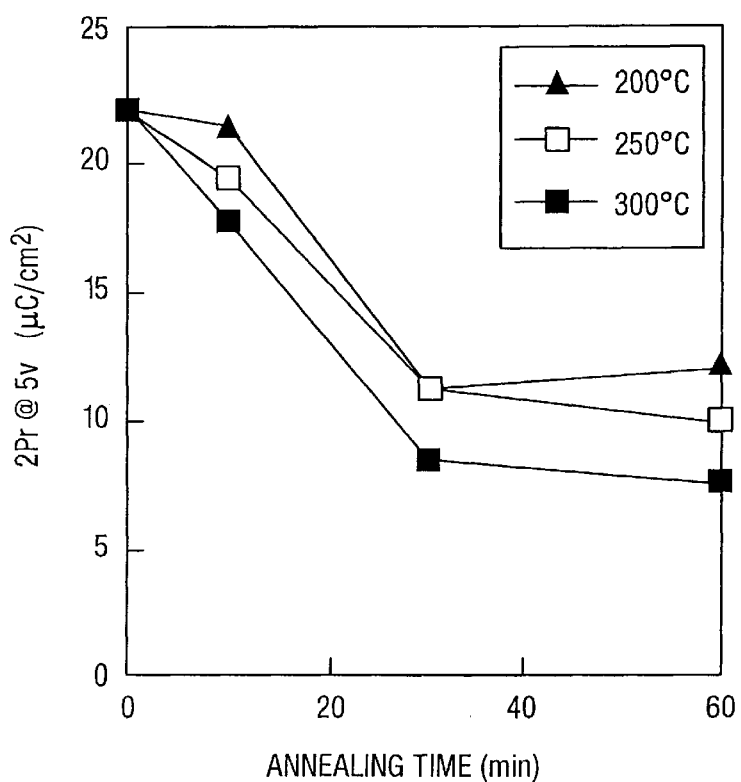
FIG. 5 is a graph of remanent polarization, 2Pr@5V, plotted as a function of annealing time in strontium bismuth tantalum niobate capacitors annealed at three different annealing temperatures.

FIG. 5 is a graph of remnant polarization, 2Pr, at 5 volts as a function of annealing time in capacitors annealed at 2000, 2500 and 300° C. FIG. 5 shows that hydrogen heat treatment at the lowest temperature, 200° C., and the shortest duration, 10 minutes, results in the least degradation of 2Pr value. The current density of the samples annealed at 200° C. for 10 minutes was about $10^{-7}$ A/cm² at 5 volts, equivalent to the value before annealing, and satisfactory for use in memory devices. The leakage current in the other samples, however, was unsatisfactorily high.

Oxygen annealing was performed on the capacitor samples that were subjected to hydrogen heat treatment as described above. The samples were annealed $O_2$-gas at a flow rate of 5 l/m, at temperatures of 200°, 300°, 400° and 800° C. for one hour. Measurements were performed on three samples for each experimental condition. The remnant polarization and the coercive field were measured at 5 volts, and the current density was measured between 0 and 10 volts. In the samples in which oxygen-recovery annealing was done at 800° C., the electronic properties of the strontium bismuth tantalum niobate capacitors recovered practically completely from the degradation caused earlier by hydrogen treatment. The electronic properties in samples annealed in oxygen at 200°, 300°, and 400° C. showed partial recovery.

EXAMPLE 2

The effect of covering the top electrode of strontium bismuth tantalum niobate capacitors with a hydrogen barrier made of titanium nitride was studied. After hydrogen annealing at 400° C. for 10 and 60 minutes, an oxygen-recovery anneal was performed at 400° C. for one hour.

Strontium bismuth tantalum niobate capacitors were again prepared according to the procedure used in Example 1 from precursor solution obtained from Hughes Aircraft Company, HAC10709-30. The solution contained amounts of chemical precursors corresponding to the stoichiometric formula $SrB_{2.18}Ta_{1.44}Nb_{0.56}O_9$. The mole ratio of niobium to tantalum, Nb/Ta, in the precursor was, therefore, about 0.4. The capacitors had an area of 7845 $\mu m^2$. Then, thin films of titanium nitride were sputter-deposited about 1800 Å thick on the strontium bismuth tantalum niobate capacitors at various deposition conditions. The titanium nitride films were deposited on the top electrode of the capacitors using a titanium sputter target with nitrogen sputter gas at gas pressure of 13 mTorr and at 160, 215, 280 and 350 W power, base pressure $5\times10^{-7}$ Torr, during 1 hour sputter time. The titanium nitride films most effective in protecting the strontium bismuth tantalum niobate capacitors against hydrogen degradation were the films with highest density, that is, the films produced at 280 W. These films had a density of 4.89 grams per cubic centimeter (g/cm) and an electrical resistivity of about 0.76 milliohms centimeter (m$\phi$cm). Auger electron spectroscopy indicated that there as more than 15 percent (15%) oxygen in the deposited film of titanium nitride. The sides of the capacitors were not coated with barrier layers.

The remanent polarization, 2Pr, in capacitors was about 26 microcoulombs per centimeter squared ($\mu C/cm^2$) measured at 5 volts before hydrogen annealing. The capacitors were hydrogen-annealed in ambient $H_2$-$N_2$ ($H_2$ 5%) mixture with a flowrate of 4 l/m at 400° C. for 10 and 60 minutes. The titanium nitride films were removed by a solution of $NH_4OH$:$H_2O_2$:$H_2O$ (1:3:1) at 60° C. and the electronic properties of the capacitors were measured. Then, oxygen-recovery annealing was performed in ambient oxygen at a $O_2$-flow rate of 4 l/m at 400° C. for 1 hour. The electronic properties were again measured and the values compared with the prior measurements.

In capacitors without the titanium nitride barrier layer, the 2Pr-value decreased about 70% to about 8 $\mu C/cm^2$ as a result of hydrogen annealing. In capacitors with the titanium nitride barrier layer sputtered at 280 W, the 2Pr-value decreased only about 25% to about 18 $\mu C/cm^2$ after hydrogen annealing at 400° C. for 10 minutes. After the oxygen-recovery anneal, the 2Pr-value recovered to about 23 $\mu C/cm^2$, that is, only about 10% less than its value before hydrogen annealing. The leakage currents of capacitors in which the titanium nitride layer was sputtered at 280 W were measured after hydrogen annealing and after oxygen annealing. The leakage current measured at 5 volts was approximately 10—2 $A/cm^2$ after hydrogen annealing at 400° C. for 10 minutes. But, after the oxygen-recovery anneal, the value improved to about $10^{-6}$ $A/cm^2$ These results show the benefit of providing a nitride hydrogen barrier layer in the inventive method.

EXAMPLE 3

The mole ratio Nb/Ta in the strontium bismuth tantalum niobate precursor solution was varied to study its effect on electronic properties of the capacitor before and after $H_2$-gas annealing at 200° C. for 10, 30 and 60 minutes. Strontium bismuth tantalate and strontium bismuth niobate precursor solutions produced by Kojundo Chemical Corporation were mixed to make a final precursor. Their respective product numbers were 34611F and 950234. The solutions were mixed as indicated in Table 1 to produce a specific stoichiometric composition and Nb/Ta mole ratio in the final precursor solution. The capacitors were fabricated using the process of Example 1.

TABLE 1

| Strontium bismuth tantalate (ml) | Strontium bismuth niobate (ml) | n-butylacetate (ml) | Precursor stoichiometry | Nb/Ta mole ratio |
|---|---|---|---|---|
| 1.2 | 0 | 0.8 | $SrBi_{2.18}Ta_2O_9$ | 0 |
| 0.864 | 0.336 | 0.8 | $SrBi_{2.18}Ta_{1.44}Nb_{0.56}O_9$ | 0.4 |
| 0.6 | 0.6 | 0.8 | $SrBi_{2.18}Ta_{1.0}Nb_{1.0}O_9$ | 1.0 |
| 0.24 | 0.96 | 0.8 | $SrBi_{2.18}Ta_{0.4}Nb_{1.6}O_9$ | 4 |
| 0 | 1.2 | 0.8 | $SrBi_{2.18}Nb_2O_9$ | no Ta |

Figure 8:
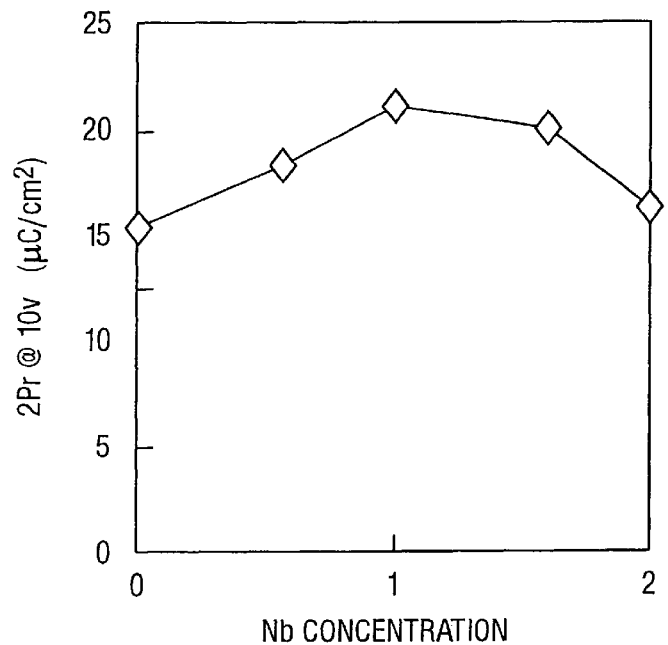
FIG. 8 is a graph of remnant polarization, 2Pr, before hydrogen annealing, measured at 10 volts in strontium bismuth tantalum niobate capacitors plotted as a function of Nb-concentration in terms of the stoichiometric formula subscript of niobium as the Nb/Ta mole ratio in the precursor is varied.
Figure 9:
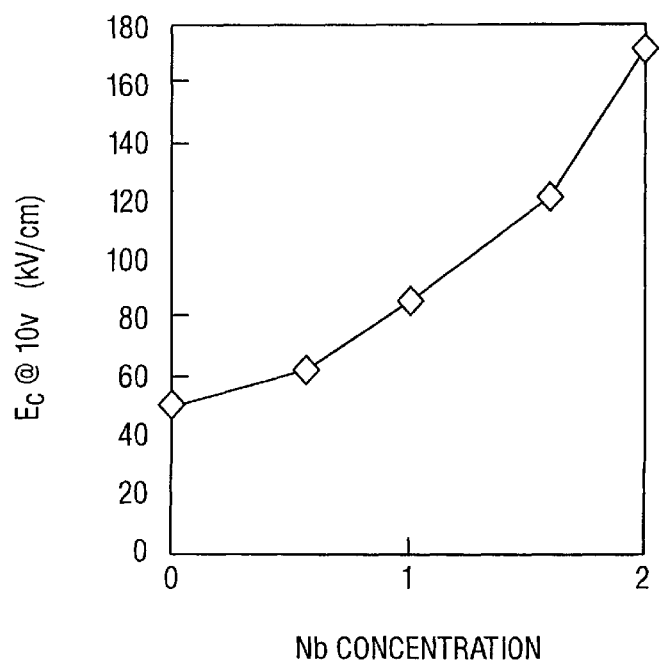
FIG. 9 is a graph of the coercive field, $E_c$, before hydrogen annealing, for strontium bismuth tantalum niobate capacitors plotted as a function of Nb-concentration in terms of the stoichiometric formula subscript of niobium as the Nb/Ta mole ratio in the precursor is varied.
Figure 10:
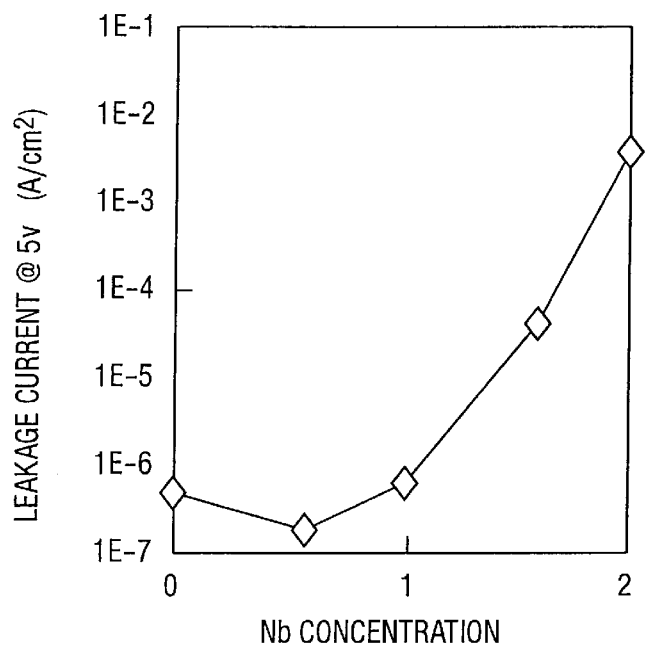
FIG. 10 is a graph of leakage current, $A/cm^2$, before hydrogen annealing, in strontium bismuth tantalum niobate capacitors measured at 5 volts plotted as a function of Nb-concentration in terms of the stoichiometric formula subscript of niobium as the Nb/Ta mole ratio in the precursor is varied.

Measurements were performed on three samples for each experimental condition. The capacitors each had an area of 7845 $\mu m^2$. The values of the electronic properties of the capacitors made from precursors with the compositions in Table 1 were measured before $H_2$-annealing and are plotted in the graphs of FIGS. 8–10. FIG. 8 is a graph of remnant polarization in microcoulombs per centimeter squared ($\mu C/cm^2$) measured at 10 volts in the strontium bismuth tantalum niobate capacitors plotted as a function of niobium concentration in terms of the stoichiometric formula subscript of niobium as the Nb/Ta ratio in the precursor is varied. It shows a maximum 2Pr value at around Nb=1. Nevertheless, the value of 2Pr at Nb=2 is questionable because of the large increase in coercive field at the high Nb-value, as shown in FIG. 9. FIG. 9 contains a graph of the coercive field, $E_c$, in kilovolts per centimeter (kV/cm), plotted as a function of niobium concentration in terms of the stoichiometric formula subscript of niobium as the Nb/Ta ratio in the precursor is varied. FIG. 9 shows that $E_c$ increases significantly with Nb-concentration. FIG. 10 is a graph of leakage current in amperes per centimeter squared ($A/cm^2$) measured at 5 volts plotted as a function of niobium concentration in terms of the stoichiometric formula subscript of niobium as the Nb/Ta ratio in the precursor is varied. FIG. 10 shows a minimum leakage current around Nb=0.56. The leakage current in the samples with Nb$\geq$1.6 is too large for most circuit applications.

Figure 11:
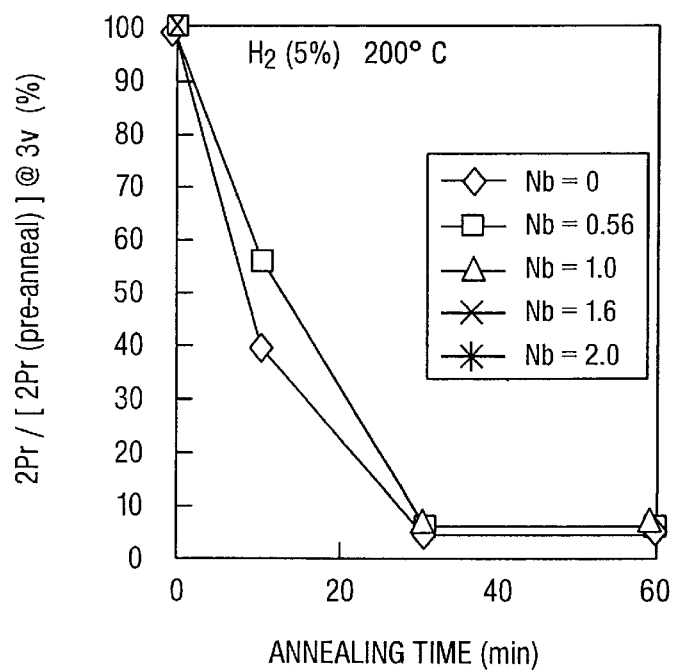
FIG. 11 is a graph of normalized remnant polarization, 2Pr/[2Pr(pre-anneal)], measured at 3 volts, plotted as a function of hydrogen annealing time at 200° C. for strontium bismuth tantalum niobate capacitors made from precursors with different Nb/Ta mole ratios, expressed in terms of the stoichiometric formula subscript of niobium.
Figure 12:
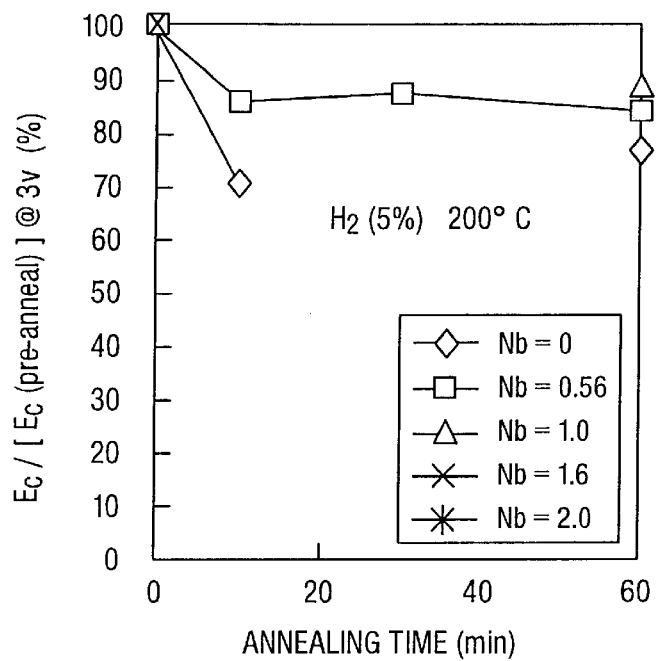
FIG. 12 is a graph of normalized coercive field, $E_c/[E_c$ (pre-anneal)], at 3 volts plotted as a function of annealing time at 200° C. of various strontium bismuth tantalum niobate capacitors made from precursors with different Nb/Ta mole ratios, expressed in terms of the stoichiometric formula subscript of niobium.
Figure 13:
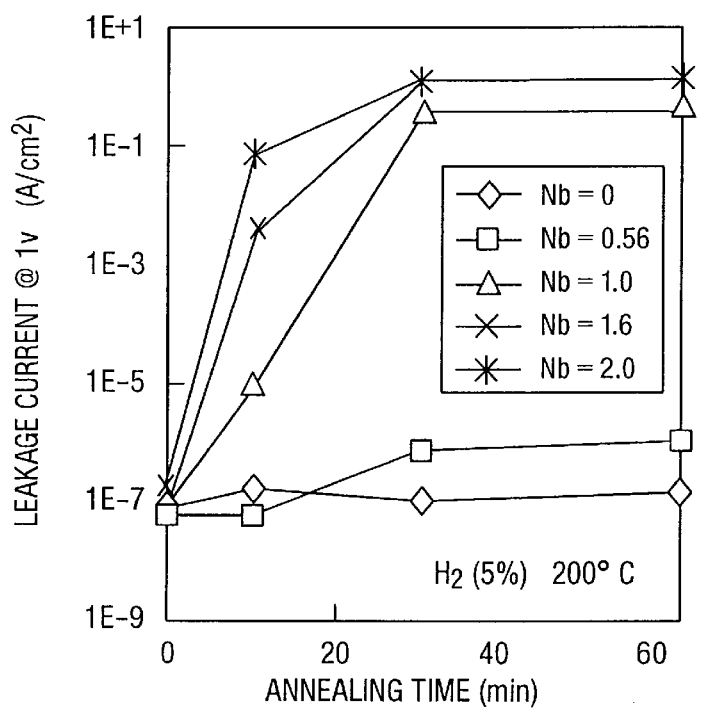
FIG. 13 is a graph of leakage current, measured at 1 volt, plotted as a function of annealing time at 200° C. for various strontium bismuth tantalum niobate capacitors made from precursors with different Nb/Ta mole ratios, expressed in terms of the stoichiometric formula subscript of niobium.

The effects of $H_2$-annealing are shown in FIGS. 11–13. The samples were annealed in $H_2$(5%)-$N_2$ ambient at 200° C. for 10, 30 and 60 minutes. FIG. 11 is a graph of normalized remnant polarization, 2Pr/[2Pr(pre-anneal)], measured at 3 volts, plotted as a function of hydrogen annealing time at 200° C. In samples with Nb$\geq$0.56 annealed 10 minutes, the 2Pr-value degraded about 45 percent. The degradation was greater in samples with Nb=0, and in all samples annealed longer than 10 minutes. For example, the degradation of remnant polarization was about 60% in the sample with Nb=0, annealed 10 minutes. Degradation was almost complete in all samples annealed for 30 or 60 minutes. FIG. 12 is a graph of normalized coercive field, $E_c/E_c$(pre-anneal), at 3 volts plotted as a function of hydrogen annealing time at 200° C. It shows that the presence of niobium in the ferroelectric precursor inhibits degradation of the $E_c$-value. FIG. 13 is a graph of leakage current measured at 1 volt plotted as a function of hydrogen annealing time in capacitors made from precursors with different Nb/Ta ratios, indicated by the stoichiometric formula subscript of niobium. The leakage current for Nb=0 and Nb=0.56 is about $10^{-7}$ A/cm$^2$, which is satisfactory for many circuit applications. The leakage current in capacitors where Nb≧1.0 is too high for many, but not all, applications.

Comparison of the various data shows that the best precursor Nb-concentration for maximizing the electronic properties of strontium bismuth tantalum niobate capacitors is about Nb=0.56 where Ta=1.44, which corresponds to a Nb/Ta mole ratio of about 0.4.

The results of other experiments show that additional Bi or Nb protects the strontium bismuth tantalum niobate capacitor against degradation by hydrogen annealing. It is believed that amounts up to forty percent in excess of the amount corresponding to a balanced stoichiometric formula. These extra amounts form additional oxides, and they inhibit hydrogen degradation probably by consuming hydrogen that would otherwise reduce the strontium bismuth tantalum niobate oxides. The high leakage in capacitors annealed at longer times seems to be caused by the additional oxide that is consumed by hydrogen. Upon its reduction by hydrogen annealing, the additional oxide forms elemental metals in the ferroelectric capacitor. The conductive metals then act as a leakage path. This suggests that the preferred fabrication process will use sufficient excess metal to "getter" significant hydrogen in its metal-oxide form, but not enough to provide a leakage path when it is reduced by hydrogen. A result of the inventive oxygen-recovery anneal is reoxidation of the metal to form an insulator.

Preliminary results with other B-site materials, such as titanium, tantalum, hafnium, tungsten and zirconium, indicates that excess amounts of other B-site materials will also inhibit the degradation resulting from exposure to hydrogen.

As discussed above, a primary feature of the invention is to reverse the detrimental effects of hydrogen degradation and recover desirable electronic properties of the ferroelectric material by performing an oxygen-recovery anneal after hydrogen process steps. For some integrated circuit devices, an oxygen-recovery anneal will be sufficient to obtain good results. However, in other cases, to obtain ferroelectric devices with good electronic properties, it is necessary to utilize additional measures. For example, hydrogen degradation can be inhibited by limiting the exposure to hydrogen, which includes exposures at temperatures under 350° C. and for times less than 30 minutes. The use of a hydrogen barrier during hydrogen treatments is also effective in protecting desired electronic properties against hydrogen degradation. As shown in Example 3 above, hydrogen degradation can be minimized by selectively choosing the relative amounts of components comprising the ferroelectric device. Similarly, good ferroelectric properties can be obtained by using precursors with selectively chosen amounts of excess metal oxide, such as excess bismuth oxide and/or excess niobium oxide.

Further, use of additional oxygen in integrated circuit layers laid down subsequent to the ferroelectric layers, such as an insulating layer laid down subsequent to the fabrication of the ferroelectric layer, which oxygen acts as a getter for hydrogen during subsequent hydrogen treatments, can also be effectively used either alone or in combination with one or more of the above measures. In this manner, the invention provides processes and/or structures that enable the prevention of the degradation of ferroelectric elements in combination with almost any exposure to hydrogen that is necessary to create and perfect the other portions of the integrated circuit.

There has been described a method and structure for fabricating ferroelectric integrated circuits that permit exposure to hydrogen and still result in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that an oxygen-recovery anneal of the integrated circuit has been identified as an important part of the process for fabricating ferroelectric memory devices, this method can be combined with other processes to provide variations on the method described. It is also evident that the steps recited may in some instances be performed in a different order. Or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating an integrated circuit comprising steps of:

forming an integrated circuit portion including a thin film of metal oxide material; and conducting an oxygen-recovery anneal, said oxygen-recovery anneal being performed at a temperature range from 300° C. to 100° C. for a time period from 20 minutes to 2 hours, wherein said metal oxide material comprises a layered superlattice compound comprising strontium bismuth tantalum niobate in which the mole ratio of niobium to tantalum, Nb/Ta, is about 0.4.

2. A method for fabricating an integrated circuit comprising steps of:

providing a substrate and a precursor liquid for forming a metal oxide material;

applying said precursor to said substrate;

treating said precursor to form said metal oxide material; and conducting an oxygen-recovery anneal, said oxygen-recovery anneal being performed at a temperature range from 300° C. to 100° C. for a time period from 20 minutes to 2 hours, wherein said metal oxide material comprises strontium bismuth tantalum niobate and said precursor contains the chemical elements strontium, bismuth, tantalum and niobium having relative molar proportions corresponding approximately to a stoichiometric formula $SrBi_{2.18}Ta_{2-x}Nb_xO_9$, where $0 \leq x \leq 2$.

3. A method according to claim 2 wherein said precursor contains relative molar proportions of the elements strontium, bismuth, tantalum and niobium corresponding approximately to a formula $SrBi_{2.18}Ta_{1.44}Nb_{0.56}O_9$.

4. A method according to claim 3 wherein said precursor contains an additional amount of niobium corresponding to between zero percent and 40 percent above a stoichiometric amount represented by said formula $SrBi_{2.18}Ta_{1.44}Nb_{0.56}O_9$.

5. A method according to claim 2 wherein the mole ratio of niobium to tantalum, Nb/Ta, is about 0.4.

6. A method for fabricating an integrated circuit comprising steps of:

providing a substrate and a precursor liquid for forming a metal oxide material;

applying said precursor to said substrate:

treating said precursor to form said metal oxide material; and conducting an oxygen-recovery anneal, said oxygen-recovery anneal being performed at a temperature range from 300° C. to 1000° C. for a time period from 20 minutes to 2 hours, wherein said metal oxide material comprises a layered superlattice compound having a B-site element and said precursor contains an excess of said B-site element corresponding to between zero percent and 40 percent above an amount represented by a balanced stoichiometric formula of said layered superlattice compound.

7. A method according to claim 2 and further comprising the step of forming a hydrogen barrier layer directly over at least a portion of said metal oxide material.

8. A method according to claim 7 wherein said hydrogen barrier layer comprises a nitride of titanium.

9. A method according to claim 7 wherein said hydrogen barrier layer comprises a nitride of silicon.

10. A method according to claim 2 further comprising the step of heating said integrated circuit portion in an atmosphere including hydrogen at a temperature less than 350° C. for a time period not greater than 30 minutes wherein said hydrogen comprises from 0.01 to 50 percent in volume of said atmosphere, and where said step of heating is performed before conducting said oxygen-recovery anneal.

11. A method for fabricating an integrated circuit comprising steps of:

providing a substrate and a precursor liquid for forming a metal oxide material;

applying said precursor to said substrate;

treating said precursor to form said metal oxide material; and conducting an oxygen-recovery anneal, said oxygen-recovery anneal being performed at a temperature range from 300° C. to 1000° C. for a time period from 20 minutes to 2 hours, wherein said metal oxide material comprises a layered superlattice compound having a superlattice generator element and said precursor contains an excess of said superlattice generator element corresponding to between zero percent and 40 percent above an amount represented by a balanced stoichiometric formula of said layered superlattice compound.

12. A method for fabricating an integrated circuit comprising steps of:

forming an integrated circuit portion including a thin film of strontium bismuth tantalum niobate wherein the mole ratio of niobium to tantalum, Nb/Ta, is about 0.4; and conducting an oxygen-recovery anneal, said oxygen-recovery anneal being performed at a temperature in a range of from 300° C. to 1000° C. for a time period between 45 minutes and 2 hours.

13. A method for fabricating an integrated circuit comprising the steps of:

forming an integrated circuit portion including a thin film of strontium bismuth tantalum niobate wherein the mole ratio of niobium to tantalum. Nb/Ta, is about 0.4; and conducting an oxygen-recovery anneal, said oxygen-recovery anneal being performed at a temperature in the range of between 500° C. and 1000° C. for a time period from 20 minutes to 2 hours.

* * * * *

UNITED STATES PATENT AND TRADEMARK OFFICE
CERTIFICATE OF CORRECTION

| | | |
|---|---|---|
| PATENT NO. | : 6,165,802 | Page 1 of 1 |
| DATED | : December 26, 2000 | |
| INVENTOR(S) | : Joseph D. Cuchiaro, Akira Furuya, Carlos A. Paz de Araujo, and Yoichi Miyasaka | |

It is certified that error appears in the above-identified patent and that said Letters Patent is hereby corrected as shown below:

<u>Column 14,</u>
Lines 32 and 48, replace "range from 300°C. to 100°C." with -- range from 300°C. to 1000°C. --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*